United States Patent
Helle et al.

(10) Patent No.: US 10,871,538 B2
(45) Date of Patent: Dec. 22, 2020

(54) PLANNING SUPPORT FOR SELECTIVE ARTERIAL SPIN LABELING MR IMAGING METHODS

(71) Applicant: KONINKLIJKE PHILIPS N.V., Eindhoven (NL)

(72) Inventors: Michael Gunter Helle, Schleswig-Holstein (DE); Peter Boernert, Hamburg (DE); Kim Cornelia Carolina Van De Ven, Geldrop (NL)

(73) Assignee: Koninklijke Philips N.V., Eindhoven (NL)

( * ) Notice: Subject to any disclaimer, the term of this patent is extended or adjusted under 35 U.S.C. 154(b) by 29 days.

(21) Appl. No.: 16/461,441

(22) PCT Filed: Nov. 16, 2017

(86) PCT No.: PCT/EP2017/079514
§ 371 (c)(1),
(2) Date: May 16, 2019

(87) PCT Pub. No.: WO2018/091612
PCT Pub. Date: May 24, 2018

(65) Prior Publication Data
US 2019/0346524 A1    Nov. 14, 2019

(30) Foreign Application Priority Data
Nov. 17, 2016 (EP) .................................... 16199252

(51) Int. Cl.
*G01R 33/563* (2006.01)
*G01R 33/54* (2006.01)
*G01R 33/56* (2006.01)

(52) U.S. Cl.
CPC ....... *G01R 33/5635* (2013.01); *G01R 33/546* (2013.01); *G01R 33/5608* (2013.01); *G01R 33/56366* (2013.01)

(58) Field of Classification Search
CPC .............. G01R 33/5635; G01R 33/546; G01R 33/5608; G01R 33/56366; G01R 33/543
See application file for complete search history.

(56) References Cited

U.S. PATENT DOCUMENTS 5,408,180 A * 4/1995 Mistretta ................. G01F 1/716
324/306
6,564,080 B1    5/2003 Kimura
(Continued)

FOREIGN PATENT DOCUMENTS

JP    2013034549 A    2/2013

OTHER PUBLICATIONS

Machine translation of JP-2013/034549 (Year: 2013).*
(Continued)

*Primary Examiner* — G. M. A Hyder (57) ABSTRACT

The invention relates to a method of MR imaging of at least a portion of a body (10) placed in a main magnetic field within the examination volume of a MR device (1). It is an object of the invention to facilitate the planning of an arterial spin labeling (ASL) MR imaging session and to improve the image quality in perfusion weighted MR imaging. The method of the invention comprises the following steps: acquiring angiographic MR signal data by subjecting the portion of the examined body (10) to one or more MR angiography scans; deriving quantitative blood flow parameters from the angiographic MR signal data; —computing a labeling efficiency of an ASL sequence from the sequence parameters of the ASL sequence and from the quantitative blood flow parameters; optimizing the sequence parameters by maximizing the labeling efficiency; acquiring perfusion (Continued)

weighted MR signal data by subjecting the portion of the body to the ASL sequence; and—reconstructing a MR image from the perfusion weighted MR signal data. Moreover, the invention relates to a MR device (1) and to a computer program for a MR device (1).

10 Claims, 3 Drawing Sheets

(56) References Cited

U.S. PATENT DOCUMENTS

| | | | | |
|---|---|---|---|---|
| 8,195,274 | B2* | 6/2012 | Wong | A61B 5/055 |
| | | | | 600/419 |
| 8,610,433 | B2* | 12/2013 | Dannels | G01R 33/56333 |
| | | | | 324/309 |
| 9,084,554 | B2* | 7/2015 | Jung | A61B 5/02028 |
| 2012/0271157 | A1 | 10/2012 | Wong et al. | |
| 2013/0231554 | A1 | 9/2013 | Jung | |
| 2013/0249547 | A1 | 9/2013 | Chappell et al. | |
| 2014/0159723 | A1 | 6/2014 | Neji et al. | |
| 2014/0270442 | A1 | 9/2014 | Jung | |
| 2015/0305645 | A1 | 10/2015 | Ouyang et al. | |

OTHER PUBLICATIONS

Helle et al "Superselective Pseudocontinuous Arterial Spin Labeling" Magnetic Resonance in Med. vol. 64, p. 777-786 (2010).
M.E. Johnson "Cerebral Blood Flow Quantification in Swine Using Pseudo-Continuous Arterial Spin Labeling" JMRI vol. 38 No. 5 p. 1111-1118 (Sep. 16, 2013).
Wong et al "Vessel-encoded arterial spin-labeling using pseudocontinuous tagging" Magnetic Resonance in Medicine vol. 58, p. 1086-1091 (2007).
Sina Aslan et al "Estimation of Lableing Efficiency in Pseudocontinuous Arterial Spin Labeling" Magnetic Resonance in Med. vol. 63, No. 3, p. 765-771 Mar. 1, 2010.
Luh et al "Optimization of Tagging Efficiency Using ECG-Gated Velocity Matched B1 Increased Pseudo-Continuous Arterial Spin Lableing" Proceedings of the International Society for Magnetic Resonance in Med. p. 3980 Apr. 23, 2011.
Ruth O'Gorman et al "In Vivo Estimation of the Flow-Driven Adiabatic Inversion Efficiency for Continous Arterial Spin Labeling . . . " Magnetic Resonance in Med. vol. 55, No. 6 May 3, 2006 p. 1291-1297.
International Search Report dated Feb. 22, 2018.
Zimine I, Petersen ET, Sardou F, Golay X. "Automatic planning for regional perfusion imaging" Proc Intl Soc Magn Reson Med 2006: p. 3426.
Kompan I, Günther M, Heitz J. "A method for automatic selection of the labeling slabs in regional arterial spin labeling" Proc Intl Soc Magn Reson Med 2009: p. 1523.
Peiying Liu et al., "Automatic and Reproducible Positioning of Phase-Contrast MRI for the Quantification of Global Cerebral Blood Flow" , PLoS ONE (vol. 9, issue 5, pp. e95721 ), May 2, 2014.
Eleanor S. K. Berry et al., "An Optimized Encoding Scheme for Planning Vessel-Encoded Pseudocontinuous Arterial Spin Labeling" Magnetic Resonance in Medicine (vol. 74, issue 5, pp. 1248-1256 ), Nov. 2015.
Nolan S. Hartkamp et al., "Mapping of cerebral perfusion territories using territorial arterial spin labeling: techniques and clinical application" NMR in Biomedicine (vol. 26, issue 8, pp. 901-912 ), Aug. 2013.

* cited by examiner

PLANNING SUPPORT FOR SELECTIVE ARTERIAL SPIN LABELING MR IMAGING METHODS

CROSS REFERENCE TO RELATED APPLICATIONS

This application is a U.S. national phase application of International Application No. PCT/EP2017/079514 filed on Nov. 16, 2017, which claims the benefit of EP Application Serial No. 16199252.4 filed on Nov. 17, 2016 and is incorporated herein by reference.

FIELD OF THE INVENTION

The present invention relates to the field of magnetic resonance (MR). It finds particular application in conjunction with MR imaging methods and MR devices for diagnostic purposes, and will be described with particular reference thereto.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second and shorter time constant $T_2$ (spin-spin or transverse relaxation time). The transverse magnetization and its variation can be detected by means of receiving RF coils which are arranged and oriented within an examination volume of the MR device in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the body, time-varying magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired of different phase encoding. Each line is digitized by collecting a number of samples. A set of k-space data is converted to an MR image by means of Fourier transformation.

Perfusion refers to the delivery of oxygen and nutrients to tissues of a patient by means of blood flow and is one of the most fundamental physiological parameters. Disorders of perfusion account for a number of the leading causes of medical disability and mortality. Several MR imaging methods for the measurement of tissue perfusion are known in the art. For example diffusible tracers that can be monitored with MR imaging may be applied. Such tracers include, for example, fluorinated halocarbons, deuterated water, $^{17}O$-water, and $^{13}C$ labeled hydrocarbons. However, magnetically labeled endogenous blood water can also be used as a tracer for perfusion MR imaging. To accomplish this, the longitudinal magnetization of arterial blood water can be manipulated so that it differs from the tissue magnetization. Such methods are usually referred to as arterial spin labeled (ASL) perfusion MR imaging (see for example U.S. Pat. No. 6,564,080 B1).

In ASL imaging, spatially selective inversion or saturation of water protons in inflowing arterial blood are used to label the blood flow. The MR signal amplitude emanating from the labeled blood is reduced or made negative relative to the unlabeled blood. When the labeled blood reaches the tissue within the imaging region, it attenuates the MR signal emanating from the perfused tissue. Voxel-by-voxel subtraction of a labeled image from a control (i.e. unlabeled) image yields a measure of the amount of labeled blood which flowed into the imaged tissue. This quantity is closely related to the tissue perfusion. The difference in the MR signal intensity for labeled and control images is typically a few percent of the tissue MR signal and, therefore, ASL difference MR images are suffering from the influence of image noise to a certain extent. Typically, several repetitions (10-50) of the ASL acquisitions are averaged to increase the signal-to-noise ratio (SNR).

ASL techniques may be applied to measure the perfusion through an individual feeding artery (referred to as 'selective' ASL). In this case, the spatially selective preparation sequence used for labeling of the blood water protons excites nuclear magnetization in a labeling area which is restricted so as to label only the blood in a single vessel or in a number of selected vessels.

Careful planning is required in selective ASL techniques to optimally label the arteries of interest and no other adjacent vessels. Usually, a pre-acquired MR angiogram, e.g. by time-of-flight MR angiography (TOF), is used to visualize the vascular architecture. This serves as a vascular map to spatially define the position of the selective labeling, e.g. by placing the labeling area over an artery of interest (see Helle et al., Magnetic Resonance in Medicine, 2010, vol. 64, p. 777-786). Apart from the optimized localization of the selective labeling, a number of other influencing factors exist that control the efficiency of the selective labeling, particularly blood flow parameters including anatomical and hemodynamic parameters of the vasculature to be used for labeling, such as blood flow velocity and vessel diameter. Those parameters can alter due to vessel location, local vessel lumen, etc. Such influences may have an impact on different sequence parameters of the used ASL sequence and the final image quality. However, in clinical practice the consideration of the above mentioned parameters makes the planning in selective ASL a time consuming process. This is also due to the fact that the labeling area is usually insufficiently visualized in the graphical user interface of the used MR apparatus. Furthermore, the above mentioned blood flow parameters are not available for the operator during planning of an ASL sequence. Therefore, positioning of a labeling area is performed based on prior knowledge of the user and experience with ASL techniques which impacts the whole planning process as well as the final image quality.

The paper 'Cerebral blood flow quantification in swine using pseudo-continuous arterial spin labeling' by M. E. Johnston et al. in JMRI 38(2013)1111-1118 (D1 mentions that PCASL parameters are tuned with respect to the velocity of the blood to be labeled.

SUMMARY OF THE INVENTION

From the foregoing it is readily appreciated that there is a need for an improved ASL MR imaging method. It is consequently an object of the invention to facilitate the planning of an ASL MR imaging session and to improve the image quality in perfusion weighted MR imaging.

In accordance with the invention, a method of MR imaging of at least a portion of a body placed in a main magnetic field within the examination volume of a MR device is disclosed. The method comprises the following steps:

acquiring angiographic MR signal data by subjecting the portion of the examined body to one or more MR angiography scans;

deriving quantitative blood flow parameters from the angiographic MR signal data;

computing a labeling efficiency of an ASL sequence from the sequence parameters of the ASL sequence and from the quantitative blood flow parameters;

optimizing the sequence parameters by maximizing the labeling efficiency;

acquiring perfusion weighted MR signal data by subjecting the portion of the body to the ASL sequence; and reconstructing a MR image from the perfusion weighted MR signal data.

According to the invention (as in conventional ASL MR imaging) the portion of the body is subjected to an ASL sequence including a (pulsed, continuous, or pseudo-continuous) preparation for labeling the blood by exciting the blood water protons outside the actual imaging area. The ASL sequence further includes acquiring MR signals from the imaging area, wherein the inflow of the labeled blood into the imaging area alters the image contrast of the MR image finally reconstructed from the acquired MR signal data. The preparation is performed by generation of RF pulses and switched magnetic field gradients that are controlled so as to excite (i.e. invert or saturate) the nuclear magnetization of blood water protons within an upstream area (labeling area), wherefrom the blood is flowing into the imaging area. MR signals are acquired from the imaging area after a transit time, at an instant at which the labeled blood has reached the imaging area. Preferably, the MR signal data are acquired after precedent preparation outside the imaging area in a labeling mode, wherein further MR signal data are acquired without precedent preparation in a control mode. This corresponds to the conventional ASL approach, in which, as mentioned above, the subtraction of a MR image acquired in labeling mode from a MR image acquired in control mode yields a measure of tissue perfusion in the imaging region.

The invention is based on the insight that for successful labeling of individual arteries in selective ASL techniques it is important to consider quantitative blood flow parameters that influence the labeling efficiency and thus the final image quality. For example, quantitative information about the vessel diameter can be used to adapt the size of the labeling area accordingly. Quantitative information about blood flow velocity in a vessel segment can be used to adapt specific labeling parameters of the ASL sequence, such as, e.g., the gradient strength in the direction of the blood flow, the labeling pulse interval, the labeling duration, etc. Moreover, information about the pathological status of a vessel segment of interest (such as, e.g., stenosis, occlusion, plaque, dissection etc.) can be considered to avoid a sub-optimal labeling efficiency due to pathological alterations of the vessel. Information about objects inside the vessel (such as, e.g., a stent after vessel dilatation) can used to exclude certain parts of a vessel for labeling.

According to the invention, angiographic MR signal data are initially acquired for planning the selective labeling procedure. It is the gist of the invention to automatically derive quantitative blood flow parameters from the angiographic MR signal data and to use these parameters to compute the labeling efficiency of the ASL sequence from the sequence parameters of the ASL sequence and from the derived quantitative blood flow parameters. The labeling efficiency can be defined as the labeled (saturated or inverted) fraction of the total magnetization of the blood water spins passing the labeling area. The invention is based on the insight that the labeling efficiency depends on the parameters of the ASL sequence (including the magnetic field gradient strengths, timing of magnetic field gradient switching, durations/amplitudes of RF pulses) as well as on the blood flow parameters (including the blood flow velocity, flow direction, vessel diameter). The computed labeling efficiency is used according to the invention as an indicator whether the parameters of the ASL sequence are appropriate.

The invention can provide efficient support to the operator of the MR device during the planning process of the ASL sequence, e.g. by presenting the blood flow parameters according to a specific location in a blood vessel that is chosen by the operator for labeling via the graphical user interface of the MR apparatus. Automatic correlation of the blood flow parameters with the key labeling parameters of the ASL sequence provides the actual labeling efficiency. The sequence parameters are optimized by maximizing the labeling efficiency, e.g. by visualization of the quantitative information (blood flow parameters and/or resulting labeling efficiency) and (interactively) adapting the labeling area (e.g. the size of the labeling area which scales with the labeling magnetic field gradient strengths). This renders the planning process in ASL MR imaging easier and more intuitive vis-à-vis the prior art. At the same time, the technique of the invention provides enough freedom to the operator in choosing the preferred ASL method or selectivity approach and adapt the selective labeling to specific conditions (e.g. altered vessel architecture, pediatric hemodynamics etc.). As a consequence, the invention facilitates the usage of selective ASL techniques in clinical routine measurements and results in optimal image quality across various patient groups.

In a preferred embodiment of the invention, the quantitative blood flow parameters and the labeling efficiency are computed for blood vessel segments covered by the labeling area defined by the sequence parameters of the ASL sequence. The quantitative blood flow parameters of the blood vessel segments in which the labeling takes place are relevant to assess the labeling efficiency as a basis for optimizing the sequence parameters.

Preferably, for interactive optimization of the sequence parameters, a visualization of the blood vessels is produced from the angiographic MR signal data and the visualization is displayed to the operator of the MR device. The interactive planning and optimization process can then be facilitated by graphically representing the labeling area superimposed on the visualization of the blood vessels, wherein the quantitative blood flow parameters and/or the labeling efficiency are displayed intuitively to the operator in spatial association with the labeling area. The labeling efficiency can then be maximized, e.g., by the operator performing a stepwise interactive adjustment of the sequence parameters of the ASL sequence, wherein the labeling efficiency is re-computed after each adjustment step.

In a further preferred embodiment, the derived quantitative blood flow parameters can be used as input parameters for an automated planning of the ASL scan. A MR angiogram is reconstructed from the angiographic MR signal data and blood vessels are identified automatically by segmentation of the MR angiogram. As a next step, a straight segment of at least one of the identified blood vessels of sufficient length can be located, the quantitative blood flow parameters are derived for the located straight segment, and the sequence parameters of the ASL sequence are then determined such that the labeling area covers the located straight segment and the labeling efficiency is optimal. Simultaneously, the transit time of blood from the labeling area to the imaging area is estimated from the angiographic MR signal data, and the sequence parameters of the ASL sequence are determined on the basis of the estimated transit time to allow the labeled blood to flow from the labeling area to the imaging area from which the perfusion weighted MR signal data are acquired.

The method of the invention described thus far can be carried out by means of a MR device including at least one main magnet coil for generating a main magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention is preferably implemented by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
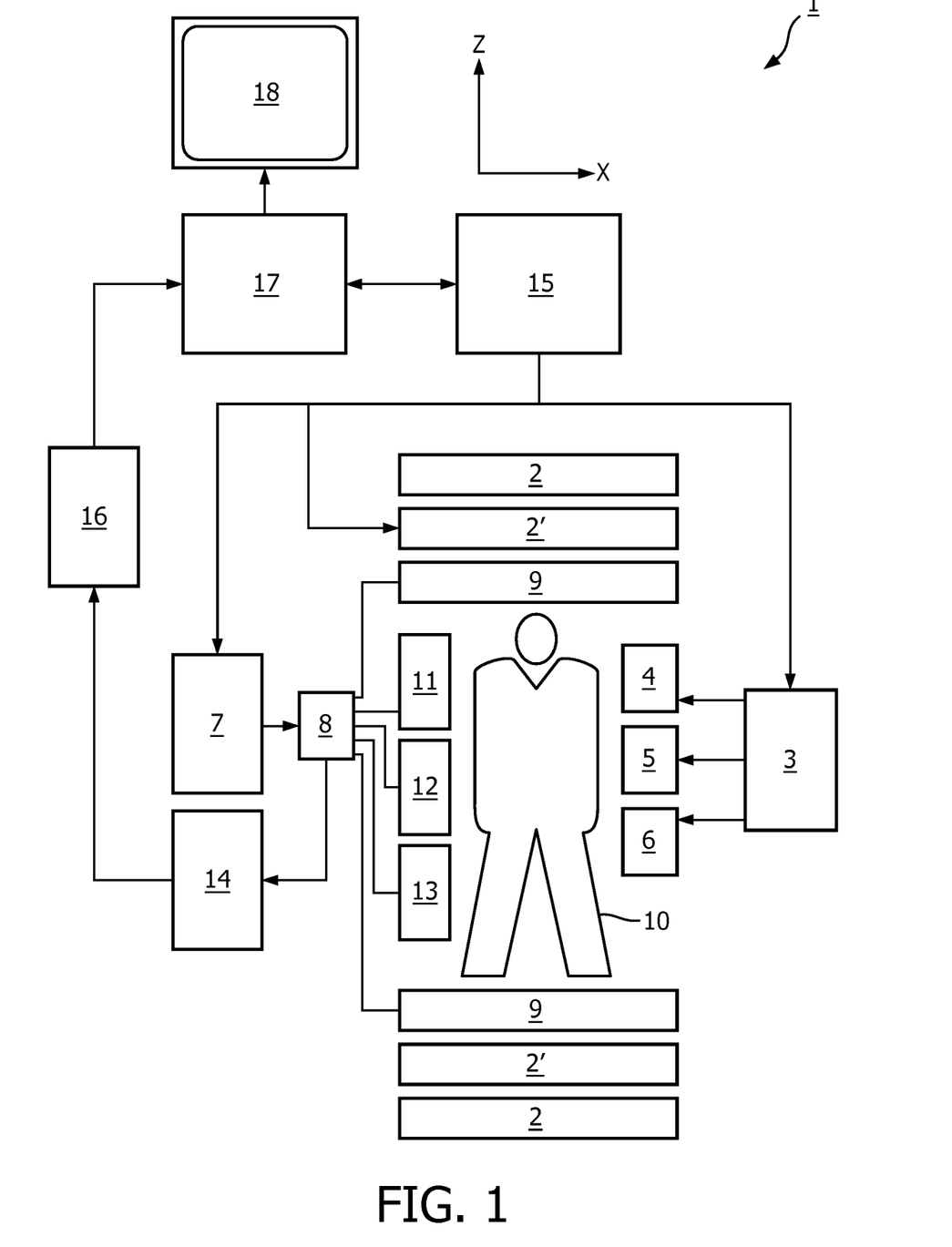
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

Most specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the current flow through the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, such like SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

In accordance with the invention, ASL perfusion imaging is applied, e.g. in order to examine the blood perfusion in the patient's brain. The host computer 15 and the reconstruction processor 17 are arranged, typically by software, to perform the method of the invention described above and in the following.

The workflow for planning and performing a selective ASL MR examination of the brain according to the invention is described in the following with reference to FIGS. 2-4.

Figure 2:
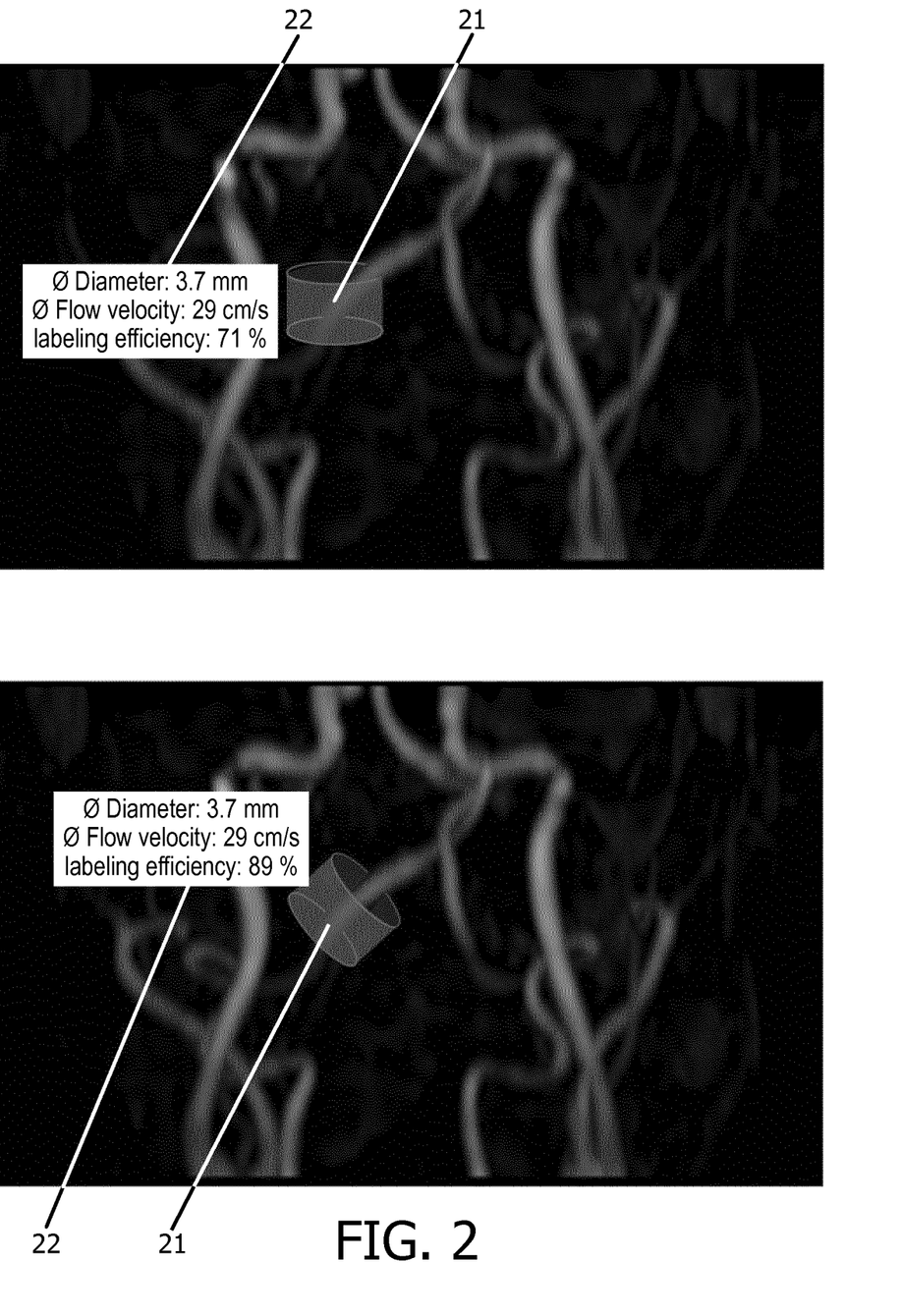
FIG. 2 shows an MR angiogram with blood vessels and a superimposed labeling area for interactively planning an ASL scan according to a first embodiment of the invention.

The embodiment illustrated in FIG. 2 relates to selective arterial spin labeling based on 'superselective' ASL' (see Helle et al., Magnetic Resonance in Medicine, 2010, vol. 64, p. 777-786) which employs a single disc-shaped spot as a labeling area to saturate or invert the blood spins in an individually selected vessel. Initially, an MR angiography scan of the neck is performed for acquiring angiographic MR signal data. Conventional time of flight (TOF) angiography is used for imaging of the vasculature of the patient. The visualization of the corresponding angiogram is shown in FIGS. 2a and 2b as two-dimensional maximum intensity projection images. The effective labeling area of the selective ASL sequence is presented to the operator by superimposing a graphical representation of the labeling area 21 on the angiogram. The diameter, thickness and orientation of the labeling area are visualized according to the moments of the magnetic field gradients to be applied for labeling. These parameters of the ASL sequence can be adjusted interactively by the operator. The operator interactively positions the visualization of the labeling area on top of a vessel of interest in the angiogram using the graphical user interface of the MR apparatus 1. A vessel segmentation algorithm is used to analyze the segment of the vessel that is covered by the labeling area and quantitative blood flow parameters (blood flow velocity, vessel diameter) are derived from the voxels of the angiogram located within the labeling area. Subsequently, the labeling efficiency in the particular vessel segment is calculated according to the sequence parameters of the ASL sequence and according to the derived quantitative blood flow parameters. The quantitative blood flow parameters and the labeling efficiency are displayed in a text box 22 in spatial association with the visualization of the labeling area 21. Any changes of the sequence parameters by the operator or re-positioning of the labeling area 21 will result in a re-calculation of the labeling efficiency so that it is made easy for the operator to find the best position for the labeling area 21. The operator interactively moves the labeling area 21 and modifies the parameters of the ASL sequence until an optimum (in the sense of adequate) labeling efficiency is achieved. This is important especially with patients having an altered arterial vasculature (plaques etc.). In the embodiment shown in FIG. 2a, the labeling area is positioned over a segment of the right vertebral artery in the neck. The vessel diameter and the blood flow velocity in the selected segment are presented to the user in the text box 22 as well as the resulting labeling efficiency taking into account the parameter settings of the applied ASL sequence. As can be seen in FIG. 2b, tilting of the labeling area results in an improved labeling efficiency as the vessel segment is now perpendicular to the disc-shaped labeling area. Finally, the ASL sequence is started with the interactively optimized sequence parameters. Perfusion weighted MR signal data are acquired and a MR image is reconstructed from the perfusion weighted MR signal data.

Figure 3:
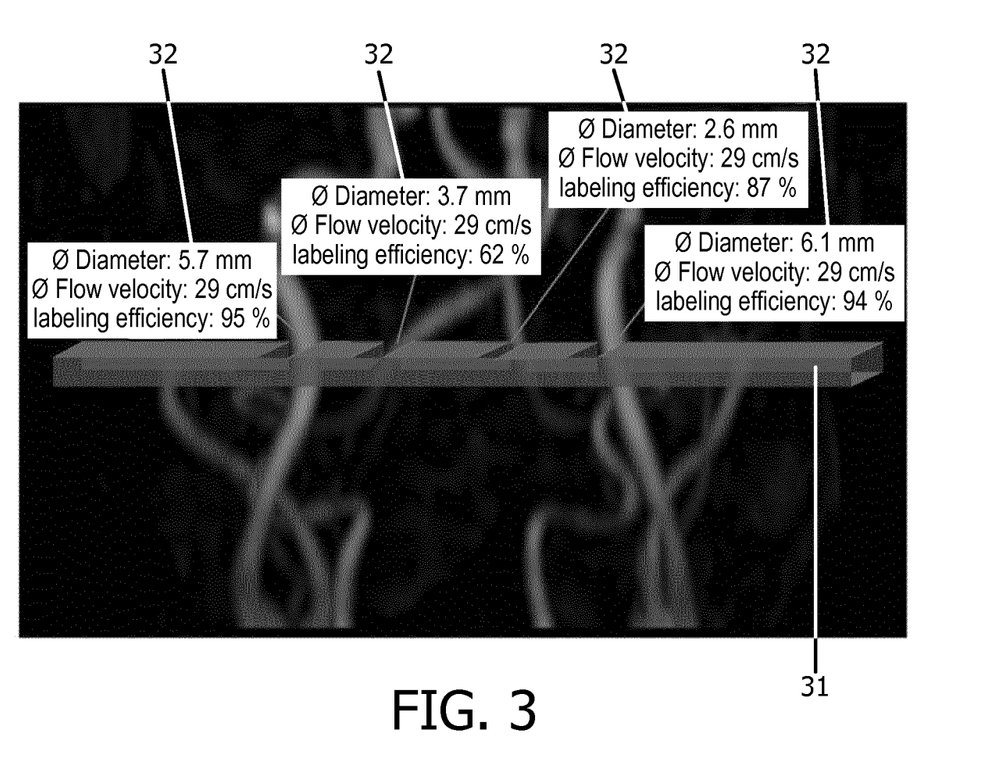
FIG. 3 shows an MR angiogram with blood vessels and a superimposed labeling area for interactively planning an ASL scan according to a second embodiment of the invention.

The embodiment illustrated in FIG. 3 relates to selective ASL using 'vessel-encoded' ASL which employs a modulation of the labeling efficiency throughout a labeling plane (see Wong et al., Magnetic Resonance in Medicine, 2007, vol. 58, p. 1086-1091). As in the embodiment shown in FIG. 2, the method starts with an MR angiography scan of the neck. A visualization of the labeling area 31 is presented to the operator in the graphical user interface of the MR apparatus 1. As can be seen in FIG. 3, the labeling plane 31 of vessel-encoded ASL includes more than one artery. The thickness of the labeling plane 31 is visualized according to the labeling gradient moments defined by the sequence parameters of the ASL sequence, which can be adjusted interactively by the operator. A vessel segmentation algorithm is used to analyze the segments of the vasculature in the angiogram that are covered by the labeling plane 31 and the quantitative blood flow parameters (blood flow velocity, vessel diameter) are derived respectively from the voxels of the angiogram located within the labeling area 31. Subsequently, the labeling efficiency in the particular vessel segment is calculated according to the sequence parameters of the ASL sequence and according to the derived quantitative blood flow parameters. The quantitative blood flow parameters and the labeling efficiency are displayed in text boxes 32 in spatial association with the corresponding vessels passing the labeling plane 31. The operator can interactively adjust the position and orientation of the labeling plane 31 and the further parameters of the ASL sequence until an optimized average labeling efficiency is obtained for the vessels passing the labeling plane 31. This may include a modulation of the labeling efficiency throughout the labeling plane 31 by adapting the gradient strengths of the magnetic field gradients of the ASL sequence switched in the direction perpendicular to the respective blood flow direction during the labeling procedure. Finally, the ASL sequence is started with the interactively optimized sequence parameters. Perfusion weighted MR signal data are acquired and a MR image is reconstructed from the perfusion weighted MR signal data.

Figure 4:
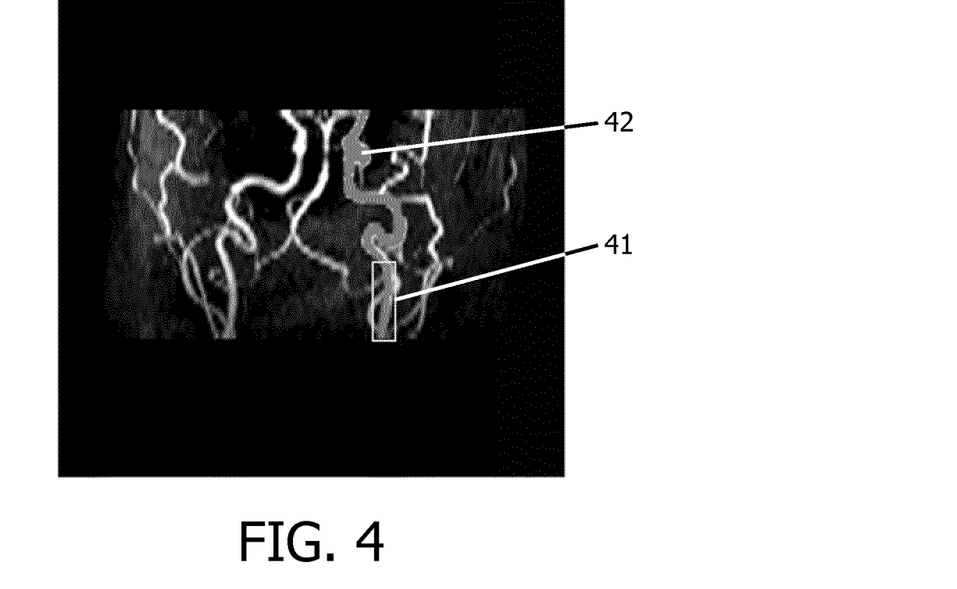
FIG. 4 shows an MR angiogram with blood vessels and a located straight vessel segment for automatic planning of an ASL scan according to a third embodiment of the invention.

The embodiment illustrated in FIG. 4 relates to fully automated planning of selective ASL based on 'superselective' ASL' (see Helle et al., Magnetic Resonance in Medicine, 2010, vol. 64, p. 777-786). As in the embodiments shown in FIGS. 2 and 3, the method starts with an MR angiography scan of the neck. A vessel segmentation algorithm is applied which automatically identifies the arteries in the neck visualized in the angiogram. The segmentation can be based on region growing algorithms, and the identification of single vessels can be performed, e.g., by using anatomical atlases and employing dedicated anatomical models. The identified arteries can be the major brain feeding vessels like both of the ICAs (internal carotid arteries), the VAs (vertebral arteries), and the BA (basilar artery), respectively. Other vessels of interest can be the external carotid arteries (ECAs), the ophthalmic arteries (OAs) etc. For each of the identified arteries, straight segments of the respective vessel lumen are segmented, e.g. by determining the deviation of the identified vessels from an anatomic model of the ideal vascular architecture or by using directional blood flow information derived from the angiographic MR signal data. FIG. 4 shows a straight segment 41 located in the left ICA 42. The pathological status, such as the presence of steno-occlusive alterations may be investigated for each of the identified vessels, e.g. by comparing the segmented vessels and the respective blood flow velocity with an anatomical model representing ideal vascular conditions. In addition, patient specific information saved in a hospital data base may be employed. Once a straight vessel segment 41 is located for each of the identified vessels, the individual diameters of the vessel lumen are estimated, e.g. based on intensity information in the angiogram. As a next step, the size of the labeling area in superselective ASL is automatically adapted by setting the strengths of the corresponding magnetic field gradients of the sequence according to the estimated vessel diameters such that the respective labeling area covers the located straight segment 41. Quantitative blood flow parameters (blood flow direction, blood flow velocity, blood flow direction) are derived from the angiographic MR signal data for the voxels of the angiogram within the located segments 41. The strengths of the labeling magnetic field gradients (in the direction of the blood flow) as well as the strengths and temporal intervals of the RF pulses of the ASL sequence are automatically adapted according to the individual blood flow velocity in each of the identified vessel segments 41 to achieve an optimal labeling efficiency for the blood water spins crossing the respective labeling area. The available data (including the pathological status) of the identified vessels allows a rough estimation of the mean transit time of blood from the labeling area to an imaging area. The sequence parameters (labeling duration and post-labeling delay) of the ASL sequence are determined on the basis of the estimated transit time to allow the labeled blood to flow from the labeling area to the imaging area from which perfusion weighted MR signal data are finally acquired. The ASL sequence is then started with fully automatically optimized sequence parameters. Perfusion weighted MR signal data are acquired and a MR image is reconstructed from the perfusion weighted MR signal data.

The approach of the invention is particularly well-suited for selective MR perfusion examinations of the brain based on the ASL technique. However, the approach of the invention may also find application for perfusion measurements in other organs, for example in abdominal or cardiac MR imaging.

The invention claimed is:
1. A method of magnetic resonance (MR) imaging of at least a portion of a body placed in a main magnetic field within an examination volume of an MR device, the method comprising:

acquiring angiographic MR signal data by subjecting the portion of the body to one or more MR angiography scans;
locating a straight segment of at least one identified blood vessel,
defining by sequence parameters of an arterial spin labeling (ASL) sequence a labeling area within said straight segment,
deriving for the located straight segment quantitative blood flow parameters from the angiographic MR signal data, the quantitative blood flow parameters comprising at least: the vessel diameter of an individual blood vessel and the flow velocity of blood through the blood vessel,
computing a labeling efficiency of the ASL sequence from the sequence parameters of the ASL sequence and from the quantitative blood flow parameters;
optimizing the sequence parameters by maximizing the labeling efficiency; wherein the size of the labeling area is adapted on the basis of quantitative information about the vessel diameter;
acquiring perfusion weighted MR signal data by subjecting the portion of the body to the ASL sequence; and
reconstructing an MR image from the perfusion weighted MR signal data.

2. The method of claim 1, further comprising: producing a visualization of blood vessels from the angiographic MR signal data; and displaying the visualization to an operator of the MR device.

3. The method of claim 2, wherein a graphical representation of the labeling area is superimposed on the visualization of the blood vessels.

4. The method of claim 3, wherein the quantitative blood flow parameters and/or the labeling efficiency are displayed to the operator in spatial association with the labeling area.

5. The method of claim 1, wherein the labeling efficiency is maximized by the operator performing a stepwise interactive adjustment of the sequence parameters of the ASL sequence, wherein the labeling efficiency is re-computed after each adjustment step.

6. The method of claim 1, further comprising: reconstruction of an MR angiogram from the angiographic MR signal data; and automatic identification of blood vessels by segmentation of the MR angiogram.

7. The method of claim 6, wherein a pathological status of at least one identified blood vessel is taken into account when deriving the quantitative blood flow parameters.

8. The method of claim 1, wherein a transit time of blood from the labeling area to an imaging area is estimated from the angiographic MR signal data, and wherein the sequence parameters of the ASL sequence are determined on the basis of the estimated transit time to allow the labeled blood to flow from the labeling area to the imaging area from which the perfusion weighted MR signal data are acquired.

9. A magnetic resonance (MR) device comprising at least one main magnet coil for generating a main magnetic field within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals, wherein the MR device is configured to:

acquiring angiographic MR signal data by subjecting the portion of the body to one or more MR angiography scans;
  locating a straight segment of at least one identified blood vessel;
  defining by sequence parameters of an arterial spin labeling (ASL) sequence a labeling area within said straight segment,
deriving for said straight segment quantitative blood flow parameters from the angiographic MR signal data;
computing a labeling efficiency of the ASL sequence from the sequence parameters of the ASL sequence and from the quantitative blood flow parameters, the quantitative blood flow parameters comprising at least: the vessel diameter of an individual blood vessel and the flow velocity of blood through the blood vessel;
optimizing the sequence parameters by maximizing the labeling efficiency, wherein the size of the labeling area is adapted on the basis of quantitative information about the vessel diameter;
acquiring perfusion weighted MR signal data by subjecting the portion of the body to the ASL sequence; and
reconstructing a MR image from the perfusion weighted MR signal data.

10. A non-transitory computer readable storage medium containing a computer program to be run on a magnetic resonance (MR) device, the computer program comprises instructions that when executed causes the MR device to:
  acquire angiographic MR signal data by performing a MR angiography scan;
  locate a straight segment of at least one identified blood vessel;
  define by sequence parameters of an arterial spin labeling (ASL) sequence a labeling area within said straight segment,
  derive for said straight segment quantitative blood flow parameters from the angiographic MR signal data, the quantitative blood flow parameters comprising at least: the vessel diameter of an individual blood vessel and the flow velocity of blood through the blood vessel;
  compute a labeling efficiency of the ASL sequence from the sequence parameters of the ASL sequence and from the quantitative blood flow parameters;
  optimize the sequence parameters by maximizing the labeling efficiency wherein the size of the labeling area is adapted on the basis of quantitative information about the vessel diameter;
  acquire perfusion weighted MR signal data by performing the ASL sequence; and
  reconstruct a MR image from the perfusion weighted MR signal data.

* * * * *